US011309503B2

(12) United States Patent
Koizumi et al.

(10) Patent No.: US 11,309,503 B2
(45) Date of Patent: Apr. 19, 2022

(54) TRANSISTOR MANUFACTURING METHOD

(71) Applicant: NIKON CORPORATION, Tokyo (JP)

(72) Inventors: Shohei Koizumi, Atsugi (JP); Takashi Sugizaki, Yokohama (JP); Yusuke Kawakami, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/374,805

(22) Filed: Apr. 4, 2019

(65) Prior Publication Data

US 2019/0229283 A1 Jul. 25, 2019

Related U.S. Application Data

(60) Division of application No. 15/156,958, filed on May 17, 2016, now Pat. No. 10,297,773, which is a
(Continued)

(30) Foreign Application Priority Data

Nov. 21, 2013 (JP) ................................ 2013-240613

(51) Int. Cl.
*H01L 51/00* (2006.01)
*H01L 51/05* (2006.01)
(Continued)

(52) U.S. Cl.
CPC ...... *H01L 51/0541* (2013.01); *C23C 18/1605* (2013.01); *C23C 18/31* (2013.01);
(Continued)

(58) Field of Classification Search
CPC ..... H01L 51/0005; H01L 51/0508–057; H01L 51/0541; H01L 51/0023;
(Continued)

(56) References Cited

U.S. PATENT DOCUMENTS 5,510,216 A * 4/1996 Calabrese ................. G03F 7/40
430/11
7,141,492 B2 11/2006 Yudasaka
(Continued)

FOREIGN PATENT DOCUMENTS

JP 2006-2201 1/2006
JP 2008-208389 9/2008

OTHER PUBLICATIONS

Taiwanese Office Action dated Feb. 27, 2019 in Taiwanese Patent Application No. 103140397.
(Continued)

*Primary Examiner* — Natalia A Gondarenko

(57) ABSTRACT

A transistor manufacturing method includes forming a source electrode and a drain electrode on a substrate, forming a layer including an insulator layer to cover the source electrode and the drain electrode, and forming a gate electrode on the layer including the insulator layer, wherein the forming the gate electrode includes forming a plating base film, forming a protection layer of the plating base film, forming a photoresist layer on the protection layer to expose the photoresist layer with desired patterning light, causing the exposed photoresist layer to come into contact with a developer to remove the photoresist layer and the protection layer until the plating base film is uncovered corresponding to the patterning light, and after depositing a metal on the uncovered plating base film, causing an electroless plating solution to come into contact with the plating base film to perform electroless plating.

12 Claims, 12 Drawing Sheets

Related U.S. Application Data continuation of application No. PCT/JP2014/080857, filed on Nov. 21, 2014.

(51) Int. Cl.

| | | |
|---|---|---|
| *H01L 21/02* | (2006.01) | |
| *H01L 21/28* | (2006.01) | |
| *H01L 21/288* | (2006.01) | |
| *H01L 29/786* | (2006.01) | |
| *C23C 18/31* | (2006.01) | |
| *C23C 18/32* | (2006.01) | |
| *C23C 28/00* | (2006.01) | |
| *C23C 18/16* | (2006.01) | |
| *H01L 29/45* | (2006.01) | |
| *H01L 29/49* | (2006.01) | |
| *H01L 27/12* | (2006.01) | |
| *G03F 7/20* | (2006.01) | |
| *G03F 7/32* | (2006.01) | |
| *G03F 7/40* | (2006.01) | |
| *C23C 18/30* | (2006.01) | |
| *C23C 18/34* | (2006.01) | |
| *C23C 18/42* | (2006.01) | |

(52) U.S. Cl.
CPC .............. *C23C 18/32* (2013.01); *C23C 28/00* (2013.01); *G03F 7/20* (2013.01); *G03F 7/32* (2013.01); *G03F 7/40* (2013.01); *H01L 27/124* (2013.01); *H01L 29/45* (2013.01); *H01L 29/458* (2013.01); *H01L 29/4908* (2013.01); *H01L 29/786* (2013.01); *H01L 51/0023* (2013.01); *H01L 51/0545* (2013.01); *C23C 18/1651* (2013.01); *C23C 18/30* (2013.01); *C23C 18/34* (2013.01); *C23C 18/42* (2013.01); *H01L 51/0005* (2013.01)

(58) Field of Classification Search
CPC ... H01L 51/0032–0095; H01L 51/0545; H01L 51/50–56; H01L 29/45; H01L 29/458; H01L 29/4908; H01L 29/41733; H01L 29/786–78696; H01L 27/124; H01L 27/3274; H01L 2924/1307; H01L 39/2429; H01L 21/02282; H01L 21/288; H01L 21/76874; H01L 2224/03424; H01L 2224/03464; C23C 18/1605; C23C 18/1651; C23C 18/30; C23C 18/31; C23C 18/32; C23C 18/34; C23C 18/42; C23C 28/00; C23C 16/48; G03F 7/20; G03F 7/40; G03F 7/32

USPC ... 438/586, 617, 623, 678, 99, 151, 29, 497, 438/790, 781, 782, 502; 257/72, 330

See application file for complete search history.

(56) References Cited

U.S. PATENT DOCUMENTS

| | | | |
|---|---|---|---|
| 7,897,968 B2 * | 3/2011 | Kuwabara | H01L 29/66765 257/57 |
| 8,871,423 B2 * | 10/2014 | Yun | G03F 7/004 430/270.1 |
| 2004/0188713 A1 | 9/2004 | Rantala | |
| 2005/0250262 A1 * | 11/2005 | Suzuki | H01L 29/4908 438/151 |
| 2007/0264814 A1 | 11/2007 | Hirai | |
| 2009/0278134 A1 | 11/2009 | Ohmi | |
| 2009/0305061 A1 | 12/2009 | Ishihara | |
| 2010/0105161 A1 | 4/2010 | Hirai | |
| 2012/0142515 A1 | 6/2012 | Wu | |
| 2014/0015900 A1 | 1/2014 | Zhang | |
| 2016/0141530 A1 | 5/2016 | Suga | |

OTHER PUBLICATIONS

International Search Report dated Feb. 3, 2015 in corresponding International Patent Application No. PCT/JP2014/080857.
International Written Opinion of the International Searching Authority dated Feb. 3, 2015 in corresponding International Patent Application No. PCT/JP2014/080857.
U.S. Notice of Allowance dated Feb. 1, 2019 in U.S. Appl. No. 15/156,958.
U.S. Office Action dated Oct. 22, 2018 in U.S. Appl. No. 15/156,958.
U.S. Office Action dated Jun. 20, 2018 in U.S. Appl. No. 15/156,958.
U.S. Advisory Action dated May 11, 2018 in U.S. Appl. No. 15/156,958.
U.S. Office Action dated Jan. 5, 2018 in U.S. Appl. No. 15/156,958.
U.S. Office Action dated Jul. 13, 2017 in U.S. Appl. No. 15/156,958.
U.S. Restriction Requirement dated Apr. 24, 2017 in U.S. Appl. No. 15/156,958.
U.S. Appl. No. 15/156,958, filed May 17, 2016, Shohei Koizumi, et al., Nikon Corporation.
Taiwan Office Action dated Sep. 17, 2019 in Taiwan Patent Application No. 103140397.

\* cited by examiner

TRANSISTOR MANUFACTURING METHOD

CROSS-REFERENCE TO RELATED APPLICATIONS

This is a Divisional Application of U.S. patent application Ser. No. 15/156,958, filed on May 17, 2016, which is a Continuation Application of International Application No. PCT/JP2014/080857, filed on Nov. 21, 2014, which claims priority to Japanese Patent Application No. 2013-240613, filed on Nov. 21, 2013. The contents of the aforementioned applications are incorporated herein by reference.

FIELD

The present invention relates to a wiring pattern manufacturing method and a transistor manufacturing method.

BACKGROUND

In the related art, chemical plating (electroless plating) which is a plating method that utilizes reduction of a material surface according to a contact action is known. Since electric energy is not used in electroless plating, it is possible to apply plating to a resin material, a glass, and the like as a nonconductor.

However, a poor plating material such as a resin material or a glass has weak adhesion to the formed plating film, and the plating easily causes abrasion such as peeling and swelling due to internal stress in the plating film.

Therefore, a method is used in which an etching process is applied to the surface of a substrate by using a chromic acid solution or the like and the surface is chemically roughened. Thereby, the plating film to be formed is formed so as to penetrate into the corrugation of the roughened resin material, and therefore, it is possible to obtain an adhesion force (anchor effect).

In addition, a method is disclosed (refer to Japanese Unexamined Patent Application, First Publication No. 2006-2201) in which a base film of SOG (Spin-on Glass) or porous SOG is provided on a surface of a poor plating substrate to apply electroless plating on the base film, or a method is disclosed (refer to Japanese Unexamined Patent Application, First Publication No. 2008-208389) in which a base film that consists of a filler component such as a fine powder silica and a resin composition component is provided on a substrate surface to apply electroless plating on the base film.

SUMMARY

Such an electroless plating technique can be used as a technique in which a photoresist layer (hereinafter, resist layer) is formed on a surface of a base film and the resist layer is exposed and developed in a predetermined pattern to thereby form a wiring pattern.

However, depending on a manufacturing condition, a phenomenon may occur in which a developer dissolves the base film when the resist layer is developed. When such a phenomenon occurs, the resist layer is removed in the width direction more than the exposed predetermined pattern at the interface between the base film and the resist layer, and the formed wiring pattern also becomes wider than a design pattern exposed in the resist layer.

An object of an aspect of the present invention is to provide a wiring pattern manufacturing method capable of forming a desired pattern with high size accuracy. Further, an object of an aspect of the present invention is to provide a transistor manufacturing method capable of manufacturing a high-performance transistor by using an electroless plating method.

A wiring pattern manufacturing method according to an aspect of the present invention includes: applying a liquid body including a first formation material on at least part of a substrate to form a plating base film; applying a liquid body including a second formation material on at least part of a surface of the plating base film to form a protection layer of the plating base film; forming a photoresist layer that includes a photoresist material on a surface of the protection layer to expose the photoresist layer with desired patterning light; causing the exposed photoresist layer to come into contact with a developer to remove the photoresist layer and the protection layer until the plating base film is uncovered corresponding to the patterning light; and after depositing a metal as a catalyst for electroless plating on a surface of the uncovered plating base film, causing an electroless plating solution to come into contact with the surface of the plating base film to perform electroless plating.

Further, a transistor manufacturing method according to an aspect of the present invention includes: forming at least one of a gate electrode, a source electrode, and a drain electrode on a substrate by using the wiring pattern manufacturing method described above.

According to an aspect of the present invention, it is possible to provide a wiring pattern manufacturing method capable of forming a desired pattern with high size accuracy. Further, it is possible to provide a transistor manufacturing method capable of manufacturing a high-performance transistor by using an electroless plating method.

DESCRIPTION OF EMBODIMENTS

[Wiring Pattern Manufacturing Method]

Hereinafter, a wiring pattern manufacturing method according to the present embodiment will be described with reference to FIG. 1 to FIG. 4. Note that, in all the following drawings, the dimensions, ratios, and the like of constituent elements are varied for ease of understanding.

Figure 1:
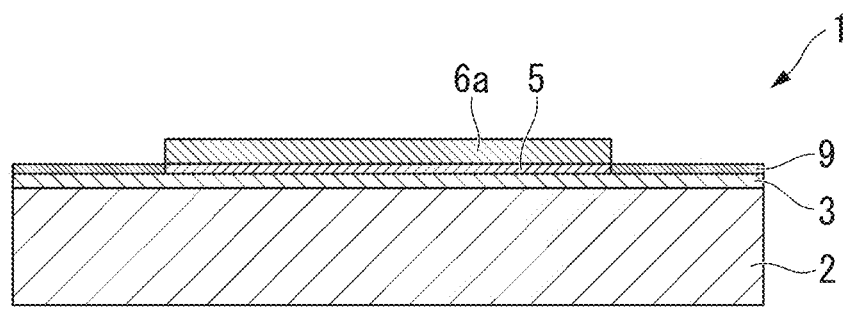
FIG. 1 is a schematic cross-sectional view of a wiring pattern that is manufactured by a wiring pattern manufacturing method of the present embodiment.

FIG. 1 is a schematic cross-sectional view of a wiring pattern that is manufactured by a wiring pattern manufacturing method of the present embodiment. A layered body 1 includes a substrate 2, a base film (plating base film) 3, a catalyst 5 for electroless plating, a wiring pattern 6a, and a protection layer 9.

The substrate 2 supports a wiring pattern that is formed on the surface. As the substrate 2, any of a substrate having optical transparency and a substrate not having optical transparency can be used in accordance with the specification or application of a formed wiring and the target of a formed structure including the wiring. For example, inorganic materials such as glass (for example, quartz glass) and silicon nitride; organic polymers (resins) such as acrylic resins, polycarbonate resins, and polyester resins (for example, polyethylene terephthalate (PET), polybutylene terephthalate (PBT), and the like); and the like can be used for the substrate 2.

The materials of the substrate 2 do not form a metallic bond together with a metal-made plating film that is formed as a result of electroless plating. Therefore, in the present embodiment, the materials of the substrate 2 is treated as a poor plating material on which a plating film is not easily formed directly and from which the formed plating film is easily exfoliated. Further, for example, a composite material of the above-mentioned materials and the like can also be similarly used as the formation material of the substrate 2.

The layered body 1 of the present embodiment is described in which a resin substrate formed by a PET resin as the formation material is used as the substrate 2.

The base film 3 is formed so as to cover the entire surface of one main surface of the substrate 2. Further, a catalyst (electroless plating catalyst) 5 is selectively provided on part of a surface of the base film 3.

The catalyst 5 is a catalyst for reducing metal ions contained in a plating solution for electroless plating. As the catalyst, metals such as silver, metal palladium, and the like are exemplified. Among the metals, metal palladium is preferably used.

The base film 3 is a film capable of forming a bond to a metal as the catalyst described above, and a silane coupling agent having a group capable of being bonded to the metal is used as a formation material of the base film 3. The base film 3 is formed by applying a liquid substance containing such a silane coupling agent onto one main surface of the substrate 2. The formation material of the base film 3 corresponds to a "first formation material".

The "silane coupling agent" as the formational material of the base film 3 is a compound in which a group capable of being bonded to the metal as the catalyst 5 and a group capable of being bonded to the substrate 2 are bonded to a silicon atom. Although the material of the substrate 2 described above does not form a metallic bond together with a metal-made plating film that is formed as a result of electroless plating, by forming such a base film 3, a metal-made plating film can be formed on the surface of the substrate 2 via the base film 3.

Here, the "group capable of being bonded to the metal" refers to a group capable of forming, for example, an ion bond or a coordinate bond with the metal as the catalyst 5 or ions of the metal. As such a group, a group having a nitrogen atom or a sulfur atom is exemplified. Examples of the group having a nitrogen atom can include an amino group, a urea group, and a group obtained by removing one or more hydrogen atoms bonded to a heterocyclic compound containing a nitrogen atom. Further, examples of the group having a sulfur atom can include a thiol group (or a mercapto group), a thiocarbonyl group, a thiourea group, and a group obtained by removing one or more hydrogen atoms bonded to a heterocyclic compound containing a sulfur atom. Examples of the heterocyclic compound containing a nitrogen atom or a sulfur atom include: monocyclic aromatic heterocyclic compounds such as pyrrole, imidazole, pyridine, pyrimidine, and thiophene; polycyclic aromatic heterocyclic compounds such as indole and benzothiophene; and non-aromatic heterocyclic compounds in which two or more carbon atoms in an aromatic ring of each of these aromatic compounds are hydrogenated.

Further, as the "group capable of being bonded to the substrate 2", a hydroxyl group and an alkoxy group of 1 to 6 carbon atoms are exemplified.

Specific examples of the compound that can be used as the formation material of such a base film 3 can include N-cyclohexyl-aminopropyltrimethoxysilane, bis(3-(trimethoxysilyl)propyl)ethylenediamine, 1-(3-(trimethoxysilylpropyl))urea, bis(3-trimethoxysilylpropyl))urea, 2,2-dimethoxy-1,6-diaza-2-silacyclooctane, N-(3-(trimethoxysilylpropyl))-4,5-dihydroimidazole, bis(3-(trimethoxysilyl)propyl)thiourea, 3-trimethoxysilylpropanethiol, and polyethyleneimine modified with a trimethoxysilylpropyl group.

Among these, as the silane coupling agent, a silane coupling agent having an amino group is preferable, and a silane coupling agent which is a primary amine having a group represented by —NH$_2$ or a secondary amine having a group represented by —NH— is more preferable. In the following description, as the base film 3, a base film formed by using a silane coupling agent as a primary amine will be described.

Note that, although it is shown in the drawing that the base film 3 is formed on the entire upper surface of the substrate 2, the base film 3 may be selectively formed on only a location where the catalyst 5 is provided. In this case, a silane coupling agent as a formation material of the base film 3 is selectively applied on the upper surface of the substrate 2 by using a generally known method, and thereby it is possible to selectively form the base film 3. Further, in the upper surface of the substrate 2, first, the silane coupling agent may be applied on a region that is larger than the region in which the base film 3 is formed, and then a film formed at a portion that protrudes from the region in which the base film 3 is formed may be irradiated with ultraviolet light to thereby decompose and remove the silane coupling agent to selectively form the base film 3.

The wiring pattern 6a is a metal electrode that is formed on a surface of the catalyst 5 and is formed of a metal that is deposited on the surface of the catalyst 5 by electroless plating as described later. As the material of the wiring pattern 6a, nickel phosphorus (NiP) or copper (Cu) is exemplified.

The formation material of the protection layer 9 is an organic silicon compound that is different from the formation material of the base film 3 described above. The protection layer 9 is formed by applying a liquid substance including such an organic silicon compound on the surface of the base film 3. The formation material of the protection layer 9 corresponds to a "second formation material".

The "organic silicon compound" as the formation material of the protection layer 9 has smaller solubility in a developer that is used in the manufacturing process of the wiring pattern than a silane coupling agent as the formation material of the base film 3.

Further, the formation material of the protection layer 9 has a hydrolysis group bonded to a silicon atom. Examples of the "hydrolysis group" bonded to a silicon atom can include an alkoxy group, an amino group, a hydroxy group, and a halogen atom. The formation material of the protection layer 9 may have one hydrolysis group bonded to a silicon atom or may have two or three. Further, as the organic silicon compound that is the formation material of the protection layer 9, not only a monosilane compound but also an organic silicon compound that includes two or more silicon atoms can be used.

As a substitution group other than the hydrolysis group included in the formation material (second formation material) of the protection layer 9, depending on the solubility in the developer described above, a substitution group is selected which has smaller solubility in the developer than the formation material (first formation material) of the base film 3. For example, when an aqueous solution such as a TMAH (tetramethylammonium hydroxide) aqueous solution is used as a developer, a material having smaller water solubility than the formation material of the base film 3 is used for the formation material of the protection layer 9.

The formation material of the base film 3 has a group capable of forming an ion bond or a coordinate bond with the metal as the catalyst 5 or ions of the metal, that is, a group that includes an unshared electron pair. Therefore, an alkyl group or an aryl group that does not include an unshared electron pair is preferable as a substitution group other than the hydrolysis group included in the formation material of the protection layer 9

Specifically, examples of a compound that is usable as such a formation material of the protection layer 9 can include hexamethyldisilazane (HMDS) and phenyltrichlorosilane (PTS).

When hexamethyldisilazane is used as the formation material, the protection layer 9 becomes a layer having hexamethyldisilane that is obtained by hydrolysis of hexamethyldisilazane as a main constituent.

When phenyltrichlorosilane is used as the formation material, the protection layer 9 becomes a layer having polysiloxane that is obtained by a reaction of phenyltrichlorosilane with water as a main constituent.

Here, relative solubility of the formation material of the base film 3 and the formation material of the protection layer 9 in a developer can be confirmed by a preliminary experiment or a theoretical calculation. For example, when the solvent of the developer is water, the determination can be made by estimating octanol/water distribution coefficients Log P as an indicator of water solubility and comparing values. It is possible to determine that when Log P is large, lipid solubility is high, and when Log P is small, water solubility is high. A value obtained by calculation, for example, using a function attached to a chemical structure drawing software (ChemDraw Pro V12, manufactured by PerkinElmer, Inc.) can be employed as Log P.

Note that, the protection layer 9 is mainly used when a wiring pattern is formed by the wiring pattern manufacturing method of the present embodiment. The function of the protection layer 9 is described later.

In the drawing, the protection layer 9 is formed on the upper surface of the base film 3; however, the protection layer 9 may be removed in the manufacturing process of the layered body 1 described later, and the protection layer 9 may not remain in the layered body 1.

Figure 2:
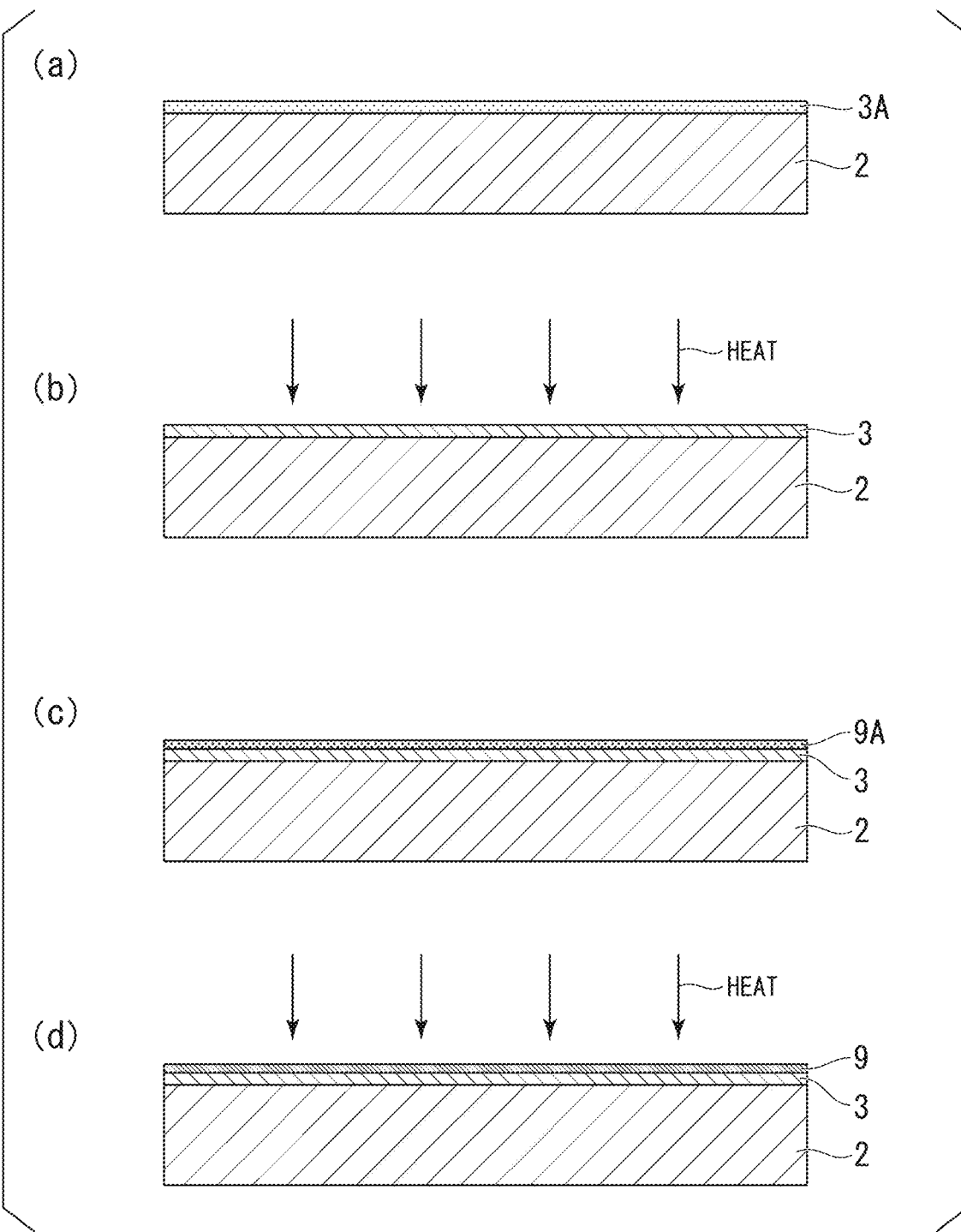
FIG. 2 is a process view showing a wiring pattern manufacturing method.
Figure 3:
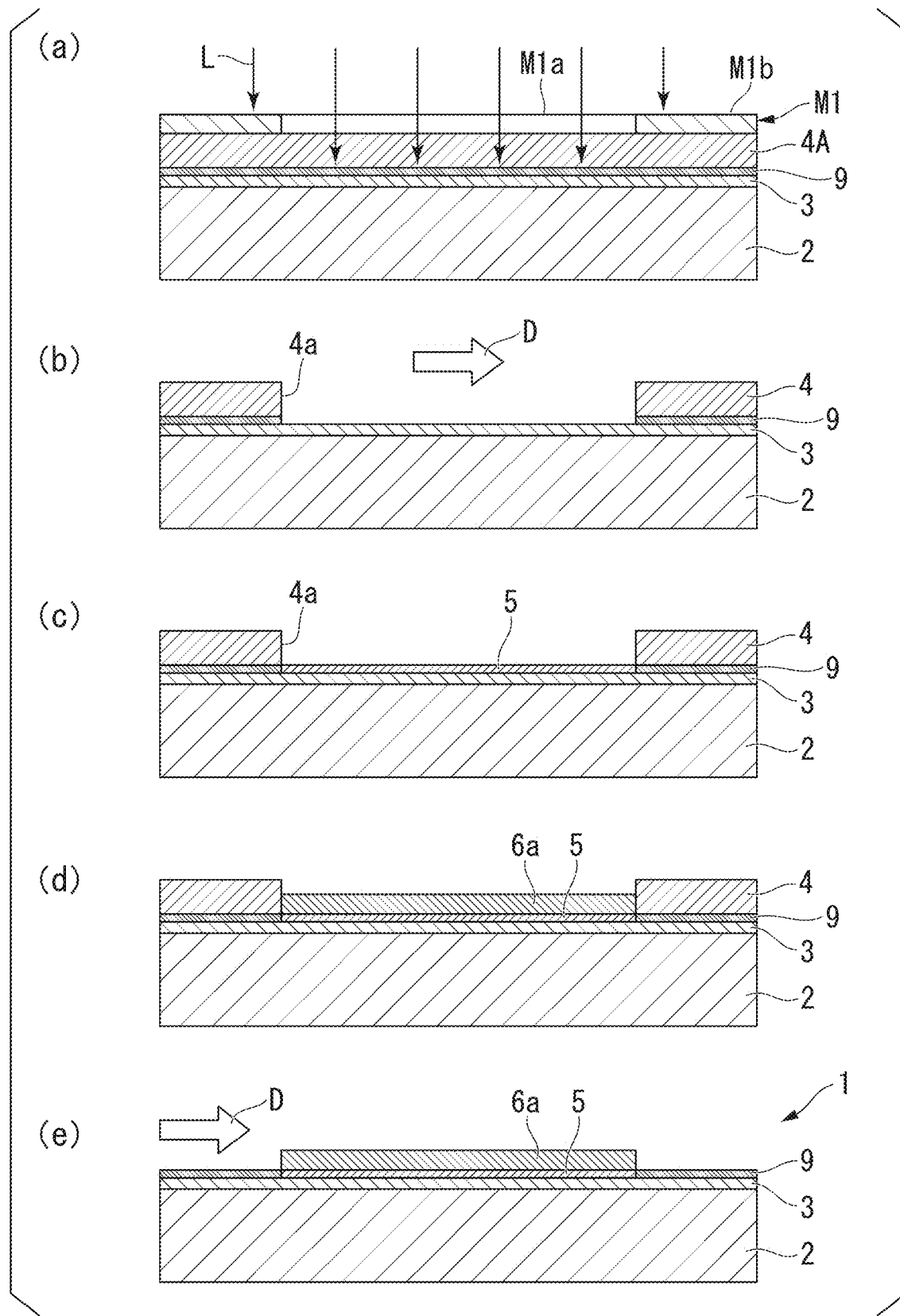
FIG. 3 is a process view showing the wiring pattern manufacturing method.

FIG. 2 and FIG. 3 are process views showing a manufacturing process of the layered body 1 described above using the wiring pattern manufacturing method of the present embodiment.

First, as shown in part (a) of FIG. 2, a liquid substance that is obtained, if necessary, by diluting the silane coupling agent as the formation material of the base film 3 with water or an organic solvent is applied onto the surface of the substrate 2 to form a coating film 3A. As the method of applying the liquid substance, generally known methods such as spin coating, dip coating, spray coating, roll coating, brushing, flexographic printing, and screen printing can be exemplified.

Here, an example is described in which 3-aminopropyltriethoxysilane that is a primary amine is used as the silane coupling agent.

As the organic solvent, various organic solvents can be used as long as the solvents are capable of dissolving the silane coupling agent. Among these organic solvents, a polar solvent can be preferably used. Examples of the solvent that can be used include: alcohols such as methanol, ethanol, 1-propanol, and 2-propanol (isopropyl alcohol (IPA)); ethers such as propylene glycol monomethyl ether acetate (PG-MEA); aromatic hydrocarbons such as toluene; nitriles such as acetonitrile; esters such as acetic acid ester; and ketones such as acetone, methyl ethyl ketone, and methyl isobutyl ketone.

Next, as shown in part (b) of FIG. 2, the solvent is volatilized and removed by a heat treatment to form a base film 3. The base film 3 formed in such a manner is a silane coupling agent layer having an extremely thin film thickness, and therefore is a transparent film in which light scattering does not easily occur. For example, when the wiring pattern manufactured by the manufacturing method of the present embodiment is provided on a substrate having optical transparency, it is possible to maintain the optical transparency as a combination of the substrate 2 and the base film 3 even when the base film 3 is formed on the entire surface of the substrate 2, and it is possible to easily form the film.

At this time, when the heat treatment temperature for forming the base film 3 is low, there may be a case in which a reaction of the "group capable of being bonded to the substrate 2" of the formation material is not completed in a set heat treatment time. For example, when a resin substrate is employed as the substrate 2, it is not possible to heat at a heat treatment temperature that is equal to or more than a deformation temperature of the substrate 2, and it is necessary to use a heat treatment temperature that is less than the deformation temperature of the substrate 2.

In the wiring pattern manufacturing method of the present embodiment, a PET substrate is used as the substrate 2. Since the continuous use temperature of the PET substrate is 105° C., the upper limit of the heat treatment temperature is 105° C. Note that, the "continuous use temperature" is lower than the deformation temperature of the substrate, is a temperature at which the substrate is usable without being deformed, and means a temperature defined by UL746B in the UL standards.

In such a case, the base film 3 may include an unreacted formation material or a region where a mesh structure is not formed and the "group capable of being bonded to the substrate 2" remains, compared to a case where heating is performed at a higher temperature (for example, 150° C.). Such a region is different from the base film obtained by completing the reaction of the formation material and is easily exfoliated or dissolved by a developer described later to be easily degraded.

Therefore, a protection layer for protecting the base film 3 is formed.

That is, as shown in part (c) of FIG. 2, a liquid substance that is obtained, if necessary, by diluting an organic silicon compound as the formation material of the protection layer 9 with water or an organic solvent is applied onto the surface of the base film 3 to form a coating film 9A. As the method of applying the liquid substance, generally known methods shown as the above-mentioned examples in a case where the coating film 3A is formed can be employed. Further, the organic solvent that is used for diluting the formation material of the base film 3 described above can be employed even as the organic material.

Here, an example is described in which phenyltrichlorosilane is used as the organic silicon compound.

Next, as shown in part (d) of FIG. 2, the solvent is volatilized and removed by a heat treatment to form a protection layer 9. At this time, the heat treatment temperature is, for example, 105° C. In the present embodiment, the main constituent of the protection layer 9 is polysiloxane that is obtained by a reaction of phenyltrichlorosilane with water.

Next, as shown in part (a) of FIG. 3, a photoresist material (hereinafter, resist material) is applied onto the protection layer 9 and is prebaked to thereby form a resist layer 4A that is not patterned. Here, as the resist material, a positive photoresist is used.

Then, the resist layer 4A is irradiated with ultraviolet light L through a mask M1 that includes an opening part M1a provided at a position corresponding to a region where a metal electrode is formed and that includes a light shielding part M1b provided at a region where the metal electrode is not formed. At this time, the resist layer 4A is irradiated with patterning light that corresponds to the pattern of the opening part M1a of the mask M1, and the resist layer 4A is exposed.

Next, as shown in part (b) of FIG. 3, a developer D that dissolves the resist layer exposed with the patterning light is caused to come into contact with the resist layer, and the resist layer is removed and developed until the base film 3 is uncovered so as to correspond to the pattering light. Thereby, a resist layer 4 in which an opening part 4a is provided is formed.

At this time, the protection layer 9 that is exposed through the opening part 4a comes into contact with the developer D, and thereby, part of the protection layer 9 is exfoliated or dissolved to be removed. However, while the protection layer 9 is present, since the base film 3 does not come into contact with the developer D, it is possible to prevent the base film 3 from being dissolved. Note that, the protection layer 9 that overlaps with the resist layer 4 is maintained.

Next, as shown in part (c) of FIG. 3, a catalyst 5 that is used in electroless plating is deposited on the surface of the base film 3 that is exposed through the opening part 4a formed in the resist layer 4. Specifically, by causing a colloidal solution of a divalent palladium salt to come into contact with the base film 3, a metal which is the catalyst 5 is deposited on the base film 3.

A general electroless plating process of a resin includes washing, etching, catalyst imparting, and electroless plating in this order. Here, "catalyst imparting" is a process of attaching a metal such as palladium (Pd) that is an electroless plating reaction initiator (catalyst), to the surface of a region where plating is applied. Generally, "catalyst imparting" includes a process in which a colloidal solution of a divalent palladium salt and a divalent tin (Sn) salt is caused to come into contact with a substrate to be attached by palladium, then the substrate is immersed into an acid or alkali solution that is called an accelerator, and thereby, the divalent palladium is reduced to zero-valent palladium to be activated.

On the other hand, as described in the present embodiment, it was confirmed by the inventors that, when the silane coupling agent which is a formation material of a base film is a primary amine or a secondary amine, the reduction treatment using the above-mentioned accelerator is not required. Therefore, when a primary amine or a secondary amine is used as the silane coupling agent, the operation of electroless plating is simplified. In the present embodiment, since 3-aminopropyltriethoxysilane which is a primary amine is used as the formation material of the base film 3, a reduction treatment is not required, and the operation is simplified.

Note that, when the silane coupling agent is a tertiary amine or a silicon compound having another "group capable of being bonded to a metal", a colloidal solution of a divalent palladium salt is applied, and then a normal treatment (activating process) that uses the above-mentioned accelerator is performed, and thereby, it is possible to deposit the catalyst 5 for electroless plating on the base film 3.

Next, as shown in part (d) of FIG. 3, an electroless plating solution is caused to come into contact with the catalyst 5. Thereby, metal ions dissolved in the electroless plating solution is reduced and deposited on the surface of the catalyst 5, and the wiring pattern 6a that include nickel phosphorus as a formation material is selectively formed in the opening part 4a. When the silane coupling agent is a primary amine or a secondary amine, the catalyst 5 is immersed in the electroless plating solution without performing the activation using the accelerator, and thereby, the surface of the catalyst 5 is plated. Therefore, it can be indirectly confirmed that metal palladium is deposited on the surface of the base film 3.

Next, as shown in part (e) of FIG. 3, the entire surface of the remaining resist layer is exposed with ultraviolet light, and then the resist layer is removed by a generally known developer D. The drawing is shown in which after the resist layer is removed, the protection layer 9 is maintained; however, the protection layer 9 may be removed depending on the condition for removing the resist layer. In this way, the layered body 1 having the wiring pattern 6a is formed.

Figure 4:
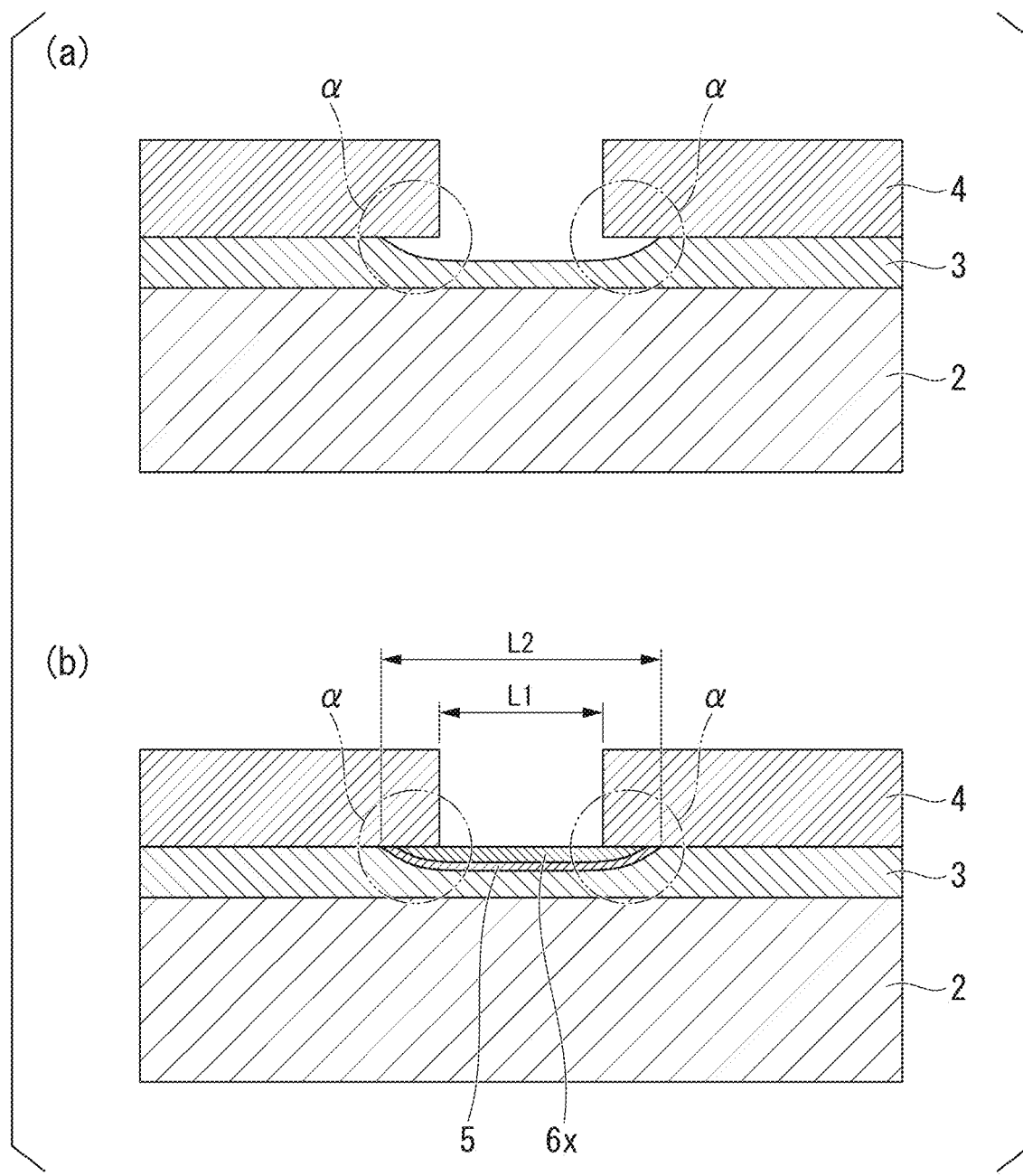
FIG. 4 is an explanation view for describing an advantage of the wiring pattern manufacturing method of the present embodiment.

FIG. 4 is an explanation view for describing an advantage of the wiring pattern manufacturing method of the present embodiment and is a schematic view showing the way in which a wiring is formed when the protection layer is not formed. Part (a) of FIG. 4 is a view corresponding to part (b) of FIG. 3, and part (b) of FIG. 4 is a view corresponding to part (d) of FIG. 3.

As shown in part (a) of FIG. 4, when the resist layer 4 is formed without providing the protection layer 9 that covers the base film 3, there is a possibility that the base film 3 is dissolved in a development process when the resist layer 4 is formed. In part (a) of FIG. 4, a region of the base film 3 that may be dissolved is shown as a section that is enclosed by a dashed line indicated by a reference numeral α.

In this case, as shown in part (b) of FIG. 4, when the catalyst 5 is deposited similarly to FIG. 3, the catalyst 5 is widely deposited by the amount of the dissolved part of the base film 3 that is enlarged to the section α. When electroless plating is performed, a wiring pattern 6x that is wider by the amount of the enlargement of the catalyst 5 is formed.

That is, when the protection layer 9 is not formed, a width L2 of the formed wiring pattern 6x is larger than a width L1 of the opening part 4a that is provided in the resist layer 4 corresponding to the exposed pattering light, and it is difficult to manufacture a wiring as designed with good accuracy.

On the other hand, as shown in FIG. 3, in the wiring pattern manufacturing method of the present embodiment in which the protection layer 9 is formed, it is possible to prevent the base film 3 from being dissolved. Therefore, the width of the formed wiring pattern 6a can be the same as the width of the opening part 4a formed corresponding to the patterning light.

Therefore, according to the wiring pattern manufacturing method as described above, a desired wiring pattern can be formed with high size accuracy.

The wiring pattern manufacturing method of the present embodiment is particularly advantageous when it is necessary to form a wiring at a condition in which the formation material of the base film easily remains in the base film while being unreacted. Examples of such a case include a case where, as described above, since heat resistance of the formation material of the substrate is low, it is necessary to set the heat treatment temperature of the base film to be low. Further, examples of such a case can include a case where it is necessary to set the heat treatment time of the base film to be short in order to shorten a manufacturing time.

[Transistor Manufacturing Method]

Hereinafter, a transistor manufacturing method according to the present embodiment will be described with reference to FIG. 5 to FIG. 9B.

Figure 5:
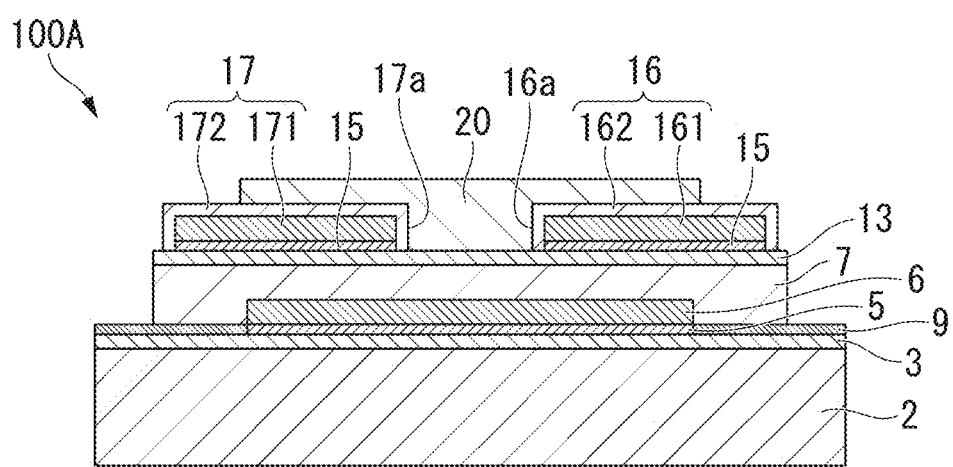
FIG. 5 is a schematic cross-sectional view of a transistor that is manufactured by a transistor manufacturing method of the present embodiment.

FIG. 5 is a schematic cross-sectional view of a transistor that is manufactured by a transistor manufacturing method of the present embodiment. A transistor 100A is a so-called bottom-contact transistor. In the following, an organic transistor that uses an organic semiconductor as a formation material of a semiconductor layer is described; however, the present invention is applicable also to an inorganic transistor that uses an inorganic semiconductor as a formation material of a semiconductor layer.

The transistor 100A includes a substrate 2, a base film 3, a catalyst 5 for electroless plating, a gate electrode (wiring) 6, an insulator layer 7, a protection layer 9, a base film 13, a catalyst 15 for electroless plating, a source electrode 16, a drain electrode 17, and an organic semiconductor layer (semiconductor layer) 20.

Note that, the substrate 2, the base film 3, the catalyst 5, and the protection layer 9 are the same as those used in the layered body 1 described above, and with respect to the gate electrode 6, the wiring pattern 6a of the layered body 1 described above is used as the gate electrode.

The insulator layer 7 is provided on the entire surface so as to cover the surfaces of the gate electrode 6, the base film 3, and the protection layer 9. The insulator layer 7 may be formed by using any of an inorganic material and an organic material as long as the insulator layer 7 has insulation properties and is capable of providing electrical insulation between the source electrode 16 and the drain electrode 17 that are provided on the surfaces of the gate electrode 6 and the insulator layer 7. As one of the inorganic and organic materials, a photo-curable resin material can be the formation material since manufacturing or microfabrication is easy. Examples of the formation material of the insulator layer 7 can include an ultraviolet curable acrylic resin, epoxy resin, ene-thiol resin, and silicone resin.

The base film 13 is formed on the entire upper surface of the insulator layer 7. The base film 13 is a source base film and a drain base film, and the source base film and the drain base film are formed as a continuous film. The base film 13 is formed so as to cover the entire surface of one main surface of the substrate 2, and a catalyst (electroless plating catalyst) 15 is selectively provided on part of the upper surface of the base film 13. The formation material of the catalyst 15 can be the same as that of the catalyst 5 described above.

The formation material of the base film 13 can be the same as that of the base film 3 described above; however, the formation materials of the base film 3 and the base film 13 may be different from each other. In the following, an example is described in which the base film 13 is formed by using a silane coupling agent as a primary amine that is the same as the base film 3.

Note that, in the drawings, the base film 13 is formed on the entire upper surface of the insulator layer 7; however, the base film 13 may be formed selectively only at a position where the catalyst 15 is provided. In this case, a silane coupling agent as a formation material of the base film 13 is selectively applied on the upper surface of the insulator layer 7 by using a generally known method, and thereby, the base film 13 can be selectively formed. Further, in the upper surface of the insulator layer 7, first, the silane coupling agent may be applied on a region that is larger than the region in which the base film 13 is formed, and then a film formed at a portion that protrudes from the region in which the base film 13 is formed may be irradiated with ultraviolet light to thereby decompose and remove the silane coupling agent and selectively form the base film 13.

The source electrode 16 and the drain electrode 17 are metal electrodes formed on the surface of the catalyst 15. The source electrode 16 has a first electrode 161 and a second electrode 162 that covers the surface of the first electrode 161. Similarly, the drain electrode 17 has a third electrode 171 and a fourth electrode 172 that covers the surface of the third electrode 171.

The first electrode 161 and the third electrode 171 are formed by electroless plating similarly to the gate electrode 6 described above. As the material of the first electrode 161 and the third electrode 171, nickel phosphorus (NiP) or copper (Cu) is exemplified. The first electrode 161 and the third electrode 171 may each be formed by the same material or may be formed by a material that is different from each other. In the present embodiment, it is described that nickel phosphorus (work function: 5.5 eV) is used as the formation material of the first electrode 161 and the third electrode 171.

The second electrode 162 is a metal plating layer that is formed so as to cover the entire surface of the first electrode 161 that does not come into contact with the catalyst 15 of the first electrode 161. That is, the second electrode 162 is provided so as to cover lateral surfaces 16a (opposing surfaces) that oppose to each other in the source electrode 16.

The fourth electrode 172 is a metal plating layer that is formed so as to cover the entire surface of the third electrode 171 that does not come into contact with the catalyst 15 of the third electrode 171. That is, the fourth electrode 172 is provided so as to cover lateral surfaces 17a (opposing surfaces) that oppose to each other in the drain electrode 17.

As the formation material of the second electrode 162 and the fourth electrode 172, a metal material having a work function in which electron transfer (or hole transfer) is easy in relation to the HOMO/LUMO level of the formation material of the semiconductor layer 20 to be described later is used. The second electrode 162 and the fourth electrode 172 may each be formed by the same material or may be formed by a material that is different from each other. The present embodiment is described using an example in which gold (work function: 5.4 eV) is used as the formation material of the second electrode 162 and the fourth electrode 172.

The semiconductor layer 20 is provided on the surface of the base film 13 between the source electrode 16 and the drain electrode 17 and is formed to come into contact with the source electrode 16 and the drain electrode 17. Specifically, the semiconductor layer 20 is provided to come into contact with the lateral surface 16a of the source electrode 16 and the lateral surface 17a of the drain electrode 17 and comes into contact with the second electrode 162 and the fourth electrode 172.

As the formation material of the semiconductor layer 20, generally known organic semiconductor materials can be used. For example, it is possible to use: p-type semiconductors such as copper phthalocyanine (CuPc), pentacene, rubrene, tetracene, and P3HT (poly(3-hexylthiophene-2,5-diyl)); and n-type semiconductors such as fullerenes such as C60 and perylene derivatives such as PTCDI-C8H (N,N'-dioctyl-3,4,9,10-perylene tetracarboxylic diimide). Among these, soluble pentacene such as TIPS pentacene (6,13-Bis(triisopropylsilylethynyl) pentacene) or an organic semiconductor polymer such as P3HT is soluble in an organic solvent such as toluene can be used in forming the semiconductor layer 20 by a wet process, and therefore, is preferable. The present embodiment is described using an example in which TIPS pentacene (HOMO level: 5.2 eV) which is a p-type semiconductor is used as the formation material of the semiconductor layer 20.

Further, the formation material of the semiconductor layer 20 is not limited to organic semiconductor materials; and generally known inorganic semiconductor materials can also be used as the formation material of the semiconductor layer 20.

As described above, the work function of nickel phosphorus as the formation material of the first electrode 161 and the third electrode 171 is 5.5 eV, the work function of gold as the formation material of the second electrode 162 and the fourth electrode 172 is 5.4 eV, and the HOMO level of TIPS pentacene as the formation material of the semiconductor layer 20 is 5.2 eV. That is, at the surface of the source electrode 16, the second electrode 162 is formed using a metal material having a work function (energy level difference with HOMO of the semiconductor layer 20 is small) at which electron transfer is easier between the second electrode 162 and the formation material of the semiconductor layer 20 compared to between the first electrode 161 and the formation material of the semiconductor layer 20. At the surface of the drain electrode 17, the fourth electrode 172 is formed using a metal material having a work function (energy level difference with HOMO of the semiconductor layer 20 is small) at which electron transfer is easier between the fourth electrode 172 and the formation material of the semiconductor layer 20 compared to between the third electrode 171 and the formation material of the semiconductor layer 20. Therefore, it is possible to reduce a Schottky resistance between the semiconductor layer 20 and the source electrode 16 and a Schottky resistance between the semiconductor layer 20 and the drain electrode 17, and electrons can be well transferred at the time of driving.

In such a transistor 100A, the gate electrode 6, the source electrode 16, and the drain electrode 17, which are formed by electroless plating, are formed on the base films 3 and 13 (gate base film, source base film, and drain base film), which are formed by using a silane coupling agent as a formation material. For example, when these electrodes are formed in a region having an uneven shape, an uneven shape is imparted to each of these electrodes in response to the unevenness of a base. Then, the distance between the electrodes laminated so as to interpose the insulator layer is not constant, and there is a possibility that the insulation is damaged and a leak current is generated at the position where the gate electrode and the source electrode are close in distance to each other or the gate electrode and the drain electrode are close in distance to each other. Further, if the base has an uneven shape, there is a possibility that an uneven shape is imparted also to the channel region of the semiconductor layer that planarly overlaps the gate electrode, and the migration distance of carriers in the channel region becomes longer to deteriorate the performance of the transistor 100A.

However, in the transistor 100A of the present embodiment, since the base films 3 and 13 are formed by using a silane coupling agent as a formation material, and the surface of the substrate is not roughened or a base film containing a filler component is not used, these base films become smooth films. Therefore, an uneven shape is not formed by forming the base films 3 and 13, and a problem caused by the uneven shape does not occur. Therefore, the transistor 100A becomes a high-performance transistor.

Hereinafter, the manufacturing method of the above transistor 100A will be described with reference to FIG. 6 to FIG. 8.

First, the gate electrode 6 is formed on one main surface of the substrate 2 by the same method as the wiring pattern manufacturing method of the present embodiment described above.

Figure 6:
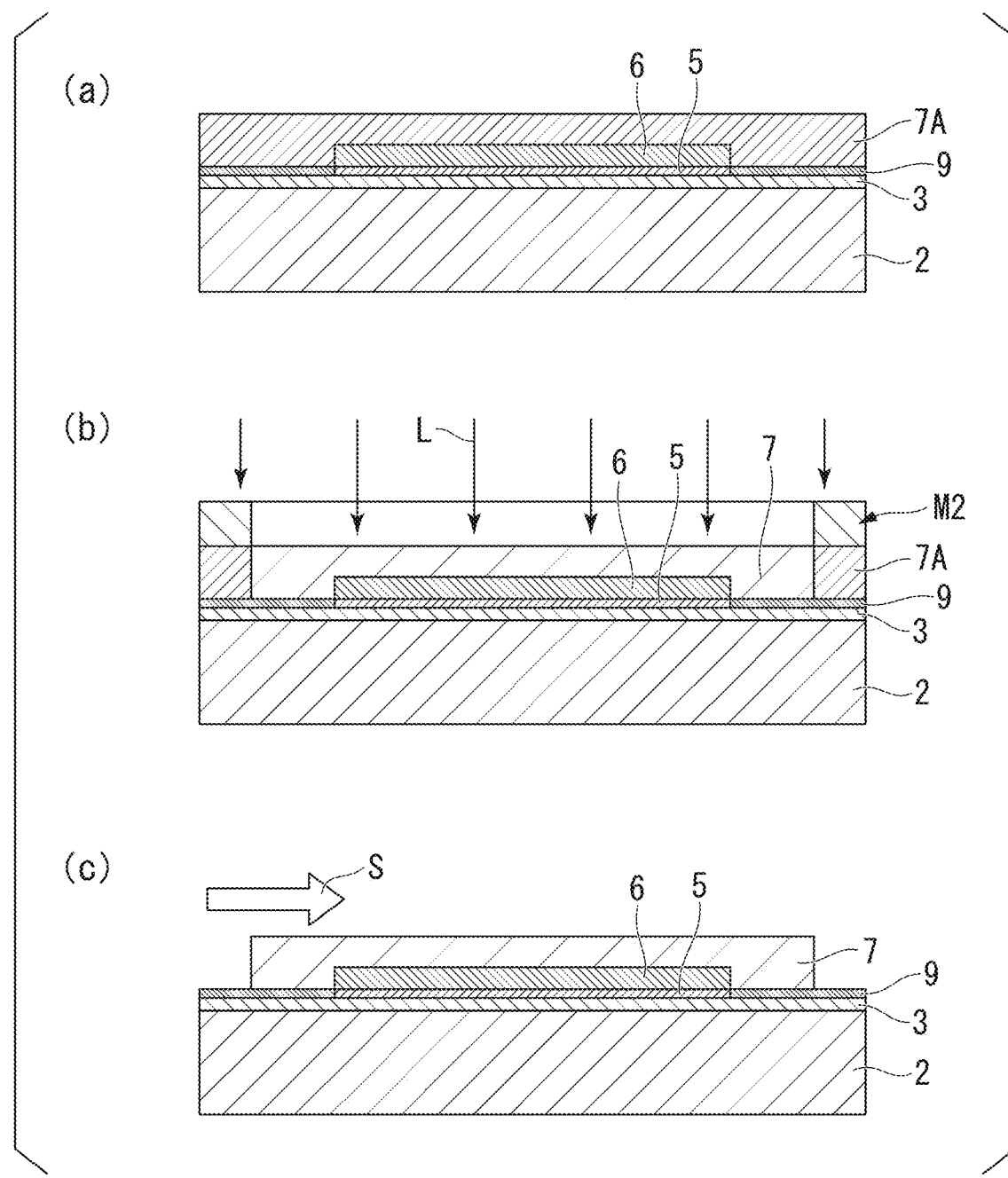
FIG. 6 is a process view showing a transistor manufacturing method.

Next, as shown in part (a) of FIG. 6, an application liquid that dissolves a precursor of a resin material having insulation properties in an organic solvent is applied on the surface of the base film 3 to cover the gate electrode 6. The above-described method can be used as the application method.

As the resin material, for example, an ultraviolet curable acrylic resin, epoxy resin, ene-thiol resin, and silicone resin can be used. Further, as the organic solvent, a polar solvent similarly to the application liquid according to the coating film 3A described above can be used. Further, in the application liquid, by changing the concentration or the type of the organic solvent, the viscosity of the entire application liquid can be adjusted, and the thickness of a coating film 7A of the application liquid can be controlled.

In the process shown in the drawings, the coating film 7A is thickly applied such that the thickness is about several hundreds of nanometers in order to prevent a leakage between the gate electrode 6 and the source electrode formed above and a leakage between the gate electrode 6 and the drain electrode formed above.

Next, as shown in part (b) of FIG. 6, the coating film 7A is irradiated with ultraviolet light L through a mask M2 in which an opening part is provided corresponding to a region where the insulator layer 7 is formed to cure the resin material, and the insulator layer 7 is formed. At this time, a thermal process can be performed during the ultraviolet light irradiation or after the ultraviolet light irradiation in order to accelerate a curing reaction of the resin material.

Next, as shown in part (c) of FIG. 6, an uncured coating film is removed by development using a solvent S that dissolves the coating film, and a patterned insulator layer 7 is formed.

Here, a configuration is described in which an application liquid that dissolves a precursor of a resin material having insulation properties in an organic solvent is applied on the surface of the base film 3 to cover the gate electrode 6 and the precursor is cured by ultraviolet light irradiation to form the insulator layer 7; however, a silane coupling agent may be applied to cover the surface including the gate electrode 6 before applying the application liquid in order to improve adhesion between the insulator layer 7 and the gate electrode 6.

Figure 7:
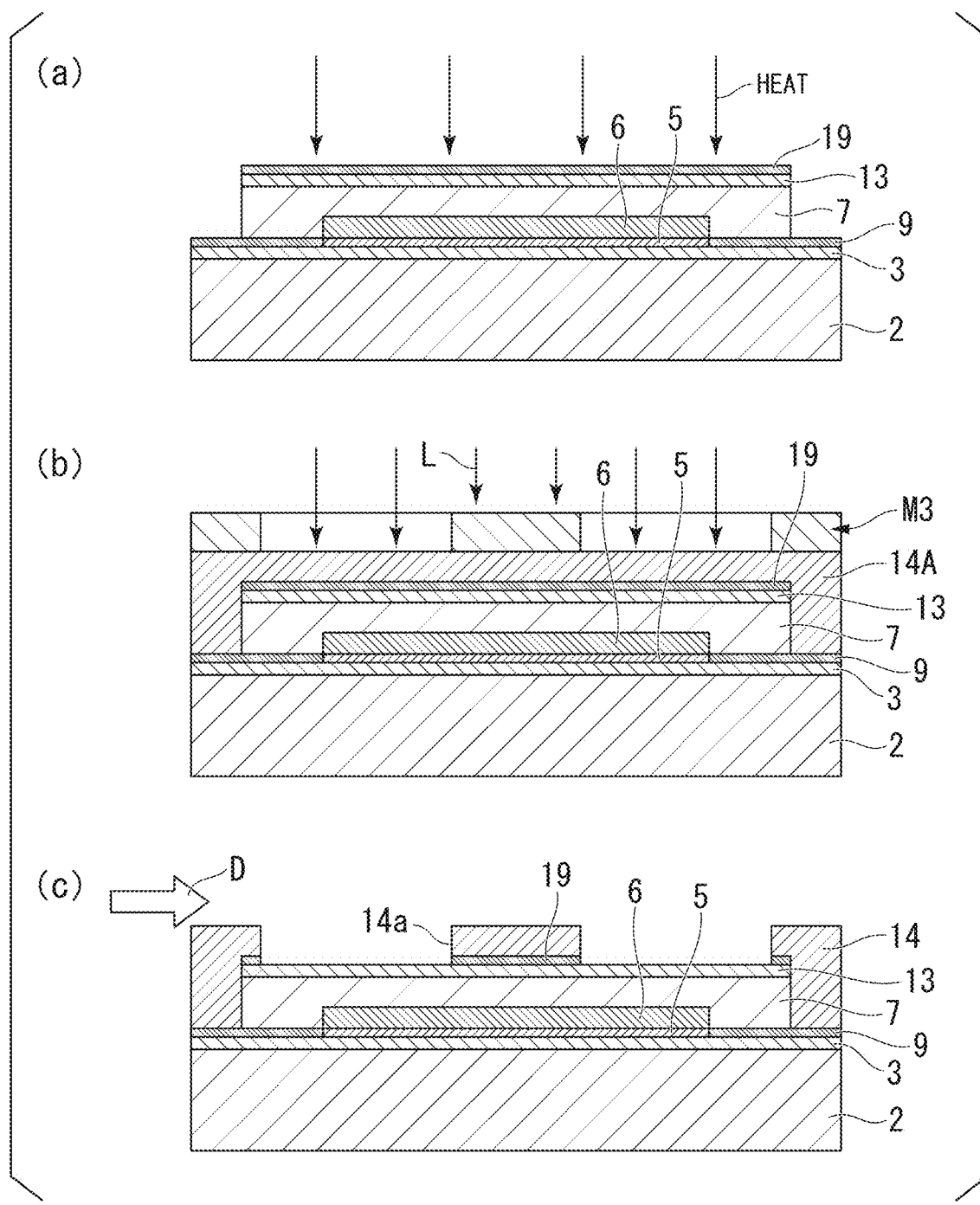
FIG. 7 is a process view showing the transistor manufacturing method.

Next, as shown in part (a) of FIG. 7, a liquid substance that is obtained by diluting the silane coupling agent (first formation material) described above with an organic solvent, if necessary, is applied onto the entire upper surface of the insulator layer 7, and the organic solvent is volatilized and removed by performing a heat treatment to form the base film 13.

Further, a liquid substance that is obtained by diluting the organic silicon compound (second formation material) described above with an organic solvent, if necessary, is applied onto the entire upper surface of the base film 13, and the organic solvent is volatilized and removed by performing a heat treatment to form a protection layer 19.

The silane coupling agent, the organic silicon compound, and the organic solvent can be the same as those shown as an example used to form the base film 3 and the protection layer 9 described above.

Next, as shown in part (b) of FIG. 7, a resist material is applied to cover the insulator layer 7 and the base film 13 and is prebaked to thereby form an unpatterned resist layer 14A. Here, as the resist material, a positive photoresist is used.

Then, the resist layer 14A is irradiated with ultraviolet light L as patterning light through a mask M3 in which an opening part is provided corresponding to a region where the source electrode and the drain electrode is formed, and the resist layer 14A is exposed.

Next, as shown in part (c) of FIG. 7, the resist layer 14A and the protection layer 19 are removed by development using a developer D that dissolves the resist layer irradiated with ultraviolet light until the base film 13 is uncovered corresponding to the pattering light, and a resist layer 14 in which an opening part 14a is provided is formed.

In part (c) of FIG. 7, the entire protection layer 19 is removed at the time of development. As shown in the formation of the protection layer 9, the protection layer 19 may remain at a section corresponding to the opening part 14a of the resist layer 14.

Figure 8:
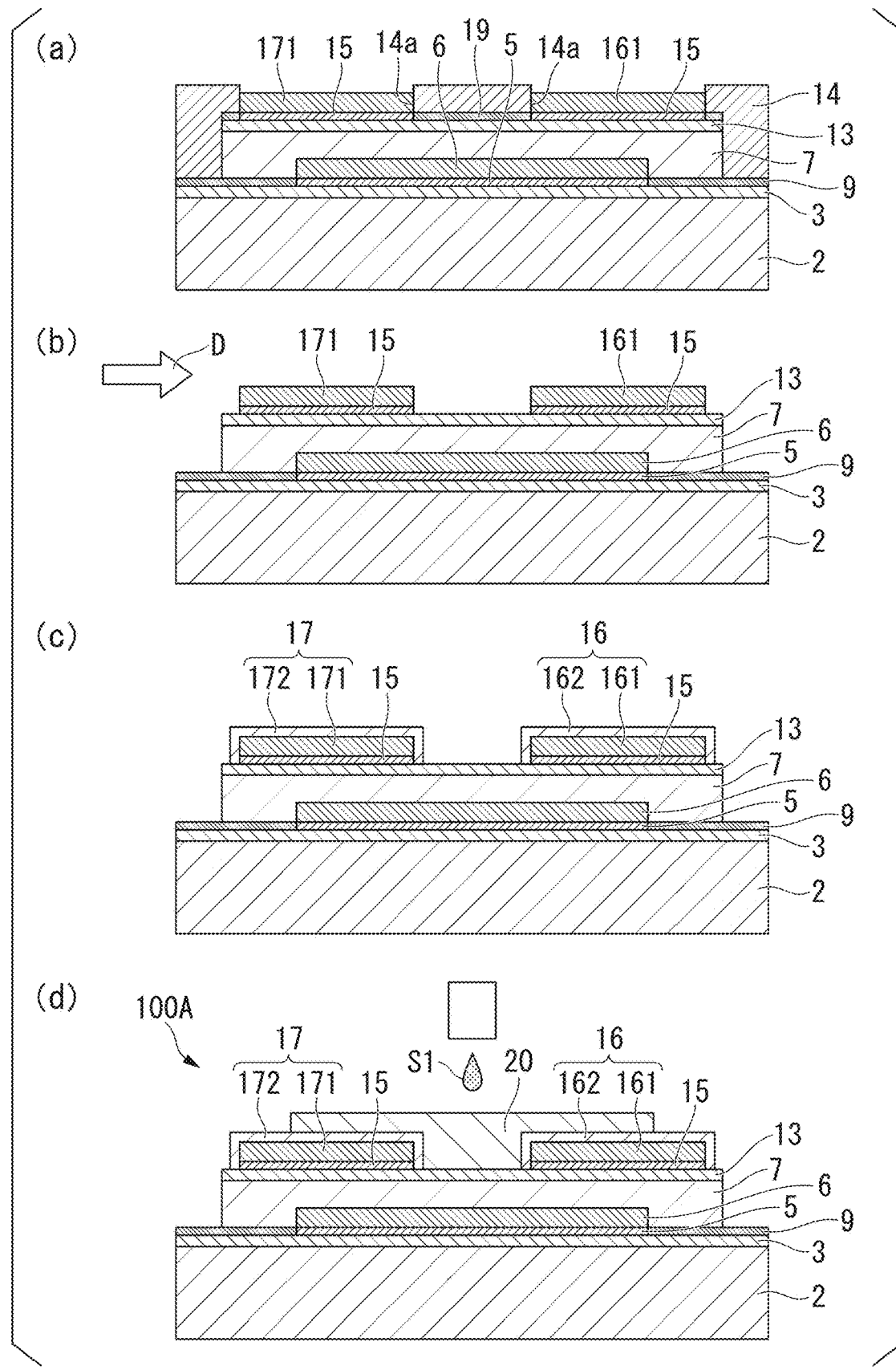
FIG. 8 is a process view showing the transistor manufacturing method.

Next, as shown in part (a) of FIG. 8, a colloidal solution of a divalent palladium salt is caused to come into contact with the base film 13 exposed through the opening part 14a, and thereby, a catalyst 15 used in electroless plating is deposited on the surface of the base film 13. Then, an electroless plating solution is caused to come into contact with the catalyst 15. Thereby, metal ions dissolved in the electroless plating solution is reduced and deposited on the surface of the catalyst 15, and the first electrode 161 and the third electrode 171 that include nickel phosphorus as a formation material are selectively formed in the opening part 14a.

Next, as shown in part (b) of FIG. 8, the entire surface of the remaining resist layer is exposed with ultraviolet light, and then the resist layer is removed by a generally known developer D. In this way, the first electrode 161 and the third electrode 171 are formed.

Next, as shown in part (c) of FIG. 8, the entire body is immersed into a gold plating bath for substitution to thereby allow the surfaces of the first electrode 161 and the third electrode 171 to be substituted and deposited with gold. Further, by the immersion in a gold plating bath for reduction, the second electrode 162 formed of gold as a formation material is formed on the surface of the first electrode 161, and the fourth electrode 172 formed of gold as a formation material is formed on the surface of the third electrode 171. In this way, the source electrode 16 and the drain electrode 17 are formed.

Next, as shown in part (d) of FIG. 8, a solution S1 in which an organic semiconductor material that is soluble in an organic solvent such as TIPS pentacene is dissolved in the organic solvent is applied between the source electrode 16 and the drain electrode 17 and is dried, and thereby, the semiconductor layer 20 is formed. Note that, here, the semiconductor layer 20 is formed by a wet method; however, a method such as a sublimation method or a transfer method can also be used.

In this way, the transistor 100A can be manufactured.

According to the transistor manufacturing method of the configuration described above, the wiring pattern manufacturing method described above is used to form the gate electrode 6, the source electrode 16, and the drain electrode 17, and therefore, desired electrodes can be formed with high size accuracy. Therefore, a high-performance transistor can be manufactured by using an electroless plating method.

Note that, the present embodiment is described using an example in which all of the gate electrode 6, the source electrode 16, and the drain electrode 17 are formed by using the wiring pattern manufacturing method described above; however, the wiring pattern manufacturing method described above may be used when at least any one of the gate electrode 6, the source electrode 16, and the drain electrode 17 is formed.

Modified Embodiment 1

Note that, the present embodiment is described using an example in which a bottom-contact transistor 100A is fabricated; however, the embodiment is not limited thereto.

Figure 9A:
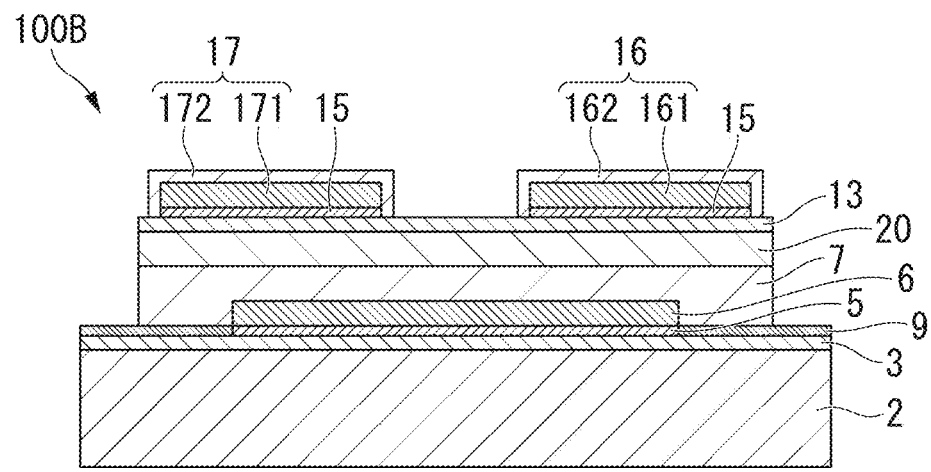
FIG. 9A is a schematic cross-sectional view showing a modified example of a transistor that is manufactured by a transistor manufacturing method of the present embodiment.
Figure 9B:
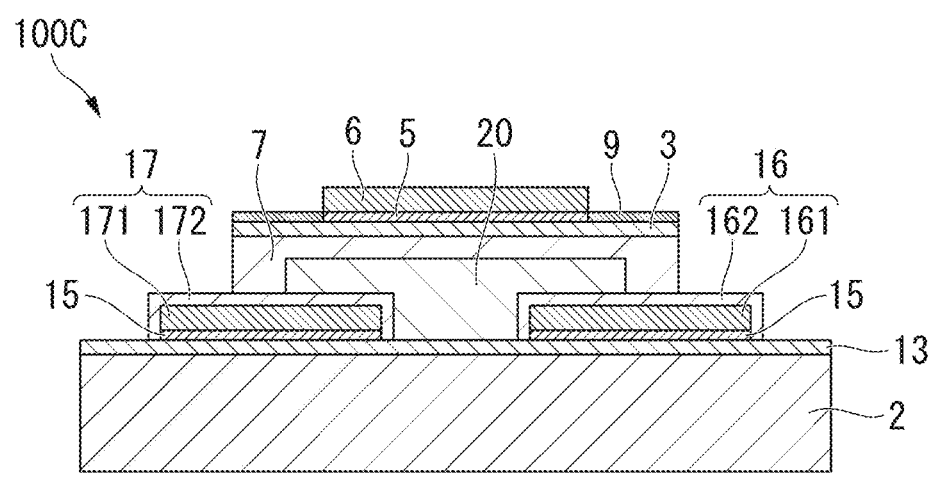
FIG. 9B is a schematic cross-sectional view showing a modified example of a transistor that is manufactured by a transistor manufacturing method of the present embodiment.

FIG. 9A and FIG. 9B are schematic cross-sectional views showing a modified example of a transistor manufactured by the transistor manufacturing method of the present embodiment. In the description of modified embodiments, the same reference numerals are imparted to the components that are common to the configurations of the transistor 100A described above, and detailed description of the components will be omitted.

The transistor 100B shown in FIG. 9A is a so-called top-contact transistor. The transistor 100B includes a semiconductor layer 20 that is arranged on an insulator layer 7 and has a surface on which a source electrode 16 and a drain electrode 17 are formed. That is, the semiconductor layer 20 is formed on the entire upper surface of the insulator layer 7, and a base film 13 is formed on the entire upper surface of the semiconductor layer 20.

A catalyst 15 is selectively provided on the upper surface of the base film 13, and the source electrode 16 including a first electrode 161 and a second electrode 162 and the drain electrode 17 including a third electrode 171 and a fourth electrode 172 are formed on the upper surface of the base film 13.

Such a transistor 100B can be manufactured by forming the gate electrode 6 on the substrate 2, forming the semiconductor layer 20 and the insulator layer 7 (layer including an insulator layer) to cover the gate electrode 6, and forming the source electrode 16 and the drain electrode 17 on the surface of the layer including an insulator layer.

The transistor 100C shown in FIG. 9B is a so-called top-gate, bottom-contact transistor. The transistor 100C includes a substrate 2 and a base film (plating base film) 13 on the surface of the substrate 2, and a source electrode 16 and a drain electrode 17 are provided on the surface of the base film 13.

A semiconductor layer 20 that comes into contact with the source electrode 16 and the drain electrode 17 is provided between the source electrode 16 and the drain electrode 17, and an insulator layer 7 is provided to cover the source electrode 16, the drain electrode 17, and the semiconductor layer 20.

A catalyst 5 and a protection film 9 are provided on the surface of the insulator layer 7, and a gate electrode 6 is provided on the catalyst 5.

Such a transistor 100C can be manufactured by forming the source electrode 16 and the drain electrode 17 on the substrate 2, forming the semiconductor layer 20 and the insulator layer 7 (layer including an insulator layer) to cover the source electrode 16 and the drain electrode 17, and forming the gate electrode 6 on the surface of the layer including an insulator layer.

In such transistors 100B, 100C, the wiring pattern manufacturing method described above is also used when at least any one of the gate electrode 6, the source electrode 16, and the drain electrode 17 is formed. That is, after a protection layer that covers the base films 3, 13 is formed, a resist layer is processed, and thereby, desired electrodes can be formed with high size accuracy. Therefore, a high-performance transistor can be manufactured by using an electroless plating method.

Examples of preferable embodiments according to the present invention have been described with reference to the accompanying drawings; however the present invention is not limited to the examples. The shapes, combination, and the like of the components described in the above-mentioned examples are merely examples, and can be variously modified based on design requirements and the like without departing from the scope of the present invention.

For example, a substrate can be made of a non-metallic material. A plurality of plating members in each of which a base film is formed on a PET substrate formed of a non-metallic material are prepared; the plating members are conveyed; and simultaneously in the conveying process, the above-mentioned manufacturing method is used to manufacture a transistor, and thereby, it is possible to form a high-performance transistor on the PET substrate.

Further, it is possible to form a transistor on a PET film according to a roll to roll process in which: a long PET film having flexibility is used as a substrate; a plating member in which a base film is formed on the film is preliminarily wound in a roll form; the plating member is conveyed while being unrolled; transistors are continuously formed using the above-mentioned manufacturing method; and then the manufactured transistors are wound in a roll form.

Further, the present embodiment is described using an example in which after a base film including a silane coupling agent as a formation material is formed, a catalyst for electroless plating is deposited on the base film, and electroless plating is performed to form a gate electrode, a source electrode, and a drain electrode; however, any one or two of the electrodes may be formed by the above method, and the rest of the electrodes may be formed by another method. For example, the gate electrode may be formed by using a generally known patterning method, and the source electrode and the drain electrode may be formed by using the above manufacturing method.

EXAMPLES

Hereinafter, the present invention will be described with reference to Examples; however, the present invention is not limited to the Examples.

In the present Example, as a first formation material, 3-aminopropyltriethoxysilane (KBE903, manufactured by Shin-Etsu Silicone Co., Ltd.) as an amine-based silane coupling agent was dissolved in methyl isobutyl ketone (hereinafter, sometimes referred to as MIBK) to prepare a liquid substance, and the liquid substance was used to form a base film. In the following description, a liquid substance in which the first formation material is dissolved is referred to as "liquid substance 1".

Further, as a second formation material, phenyltrichlorosilane was dissolved in MIBK such that the concentration was 0.1 mass % to prepare a liquid substance, and the liquid substance was used to form a protection layer. In the following description, a liquid substance in which the second formation material is dissolved is referred to as "liquid substance 2".

Wiring Pattern Formation 1

Example 1

The surface of a PET substrate (Model number: A-4100 (no coat), manufactured by Toyobo Co., Ltd.) was cleaned with atmospheric-pressure oxygen plasma, and then the liquid substance 1 in which the first formation material was dissolved such that the concentration was 0.5 mass % was applied onto the PET substrate by dip coating. The pulling-up speed in the dip coating was 1 mm/sec. Then, the PET substrate was heated at 105° C. for 15 minutes, and a base film was formed.

Note that, in the following process, the above condition was also employed for the pulling-up speed in the dip coating.

Next, the liquid substance 2 was applied by dip coating on the PET substrate in which the base film was formed. Then, the PET substrate was heated at 105° C. for 10 minutes, and a protection layer was formed.

Next, a resist material (SUMIRESIST PFI-34A6, manufactured by Sumitomo Chemical Co., Ltd.) was applied by dip coating to the PET substrate in which the protection layer was formed, and by heating (prebaking) at 105° C. for 5 minutes, a resist layer was formed.

Next, the resist layer was exposed for 2 seconds with ultraviolet light having an intensity of 29 mW/cm$^2$ through a photomask, was heated (post-baked) at 105° C. for 15 minutes, and then was immersed into a 2.38% TMAH solution for 1.5 minutes. Thereby, a mask pattern was developed in the resist layer, and an opening part was formed.

Next, the substrate in which the resist layer having an opening part was formed was ultrasonically water-washed at room temperature for 30 seconds, and then was immersed into a catalyst colloidal solution for electroless plating (Melplate activator 7331, manufactured by Meltex Corporation) at room temperature for 60 seconds, and a catalyst was adhered to the base film exposed through the opening part of the resist layer.

Next, the surface was washed with water and then was immersed into an electroless plating solution (Melplate NI-867, manufactured by Meltex Corporation) at 73° C. for 60 seconds to deposit nickel-phosphorus (NiP) on the catalyst adhered to the opening part of the resist layer, and nickel-phosphorus plating was performed.

Next, the surface was water-washed and then was dried, and the entire surface including the remaining resist layer was exposed to ultraviolet light having an intensity of 29 mW/cm$^2$ for 1 minute and then was immersed into ethanol for 1 minute to thereby remove the resist layer and fabricate a wiring pattern.

Example 2

A wiring pattern was fabricated similarly to Example 1 other than using hexamethyldisilazane (12058-1A, manufactured by Kanto Chemical Co., Inc.) as a formation material of the protection layer and using hexamethyldisilazane without being diluted by a solvent to form the protection layer.

Comparative Example 1

A wiring pattern was fabricated similarly to Example 1 other than forming a base film by using the liquid substance 1 in which the first formation material was dissolved such that the concentration was 0.2 mass % and forming no protection layer.

Figure 10:
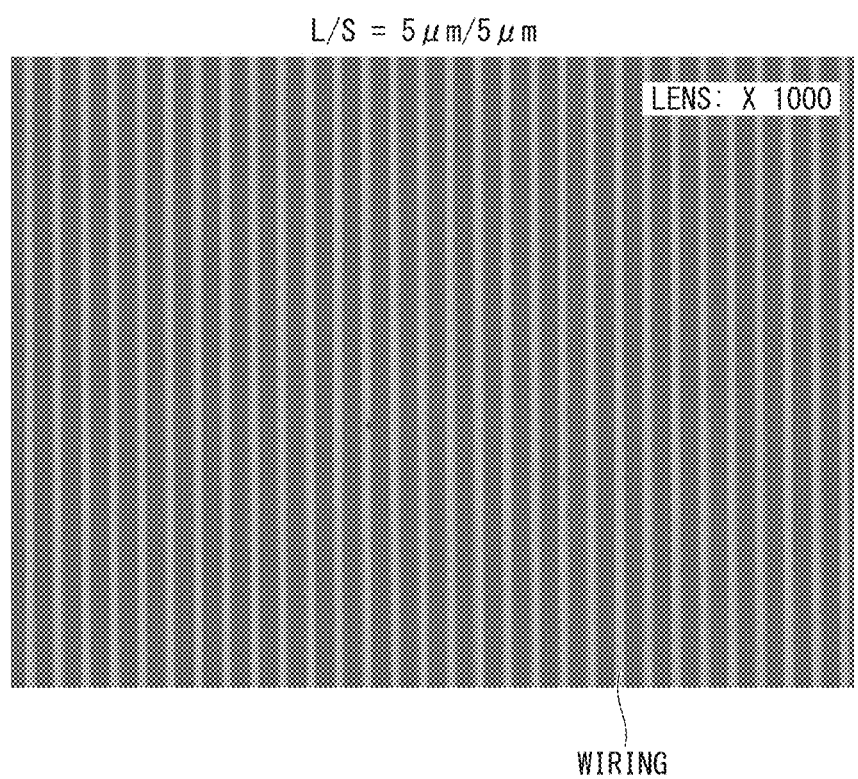
FIG. 10 shows a photograph showing a result of Example.
Figure 11:
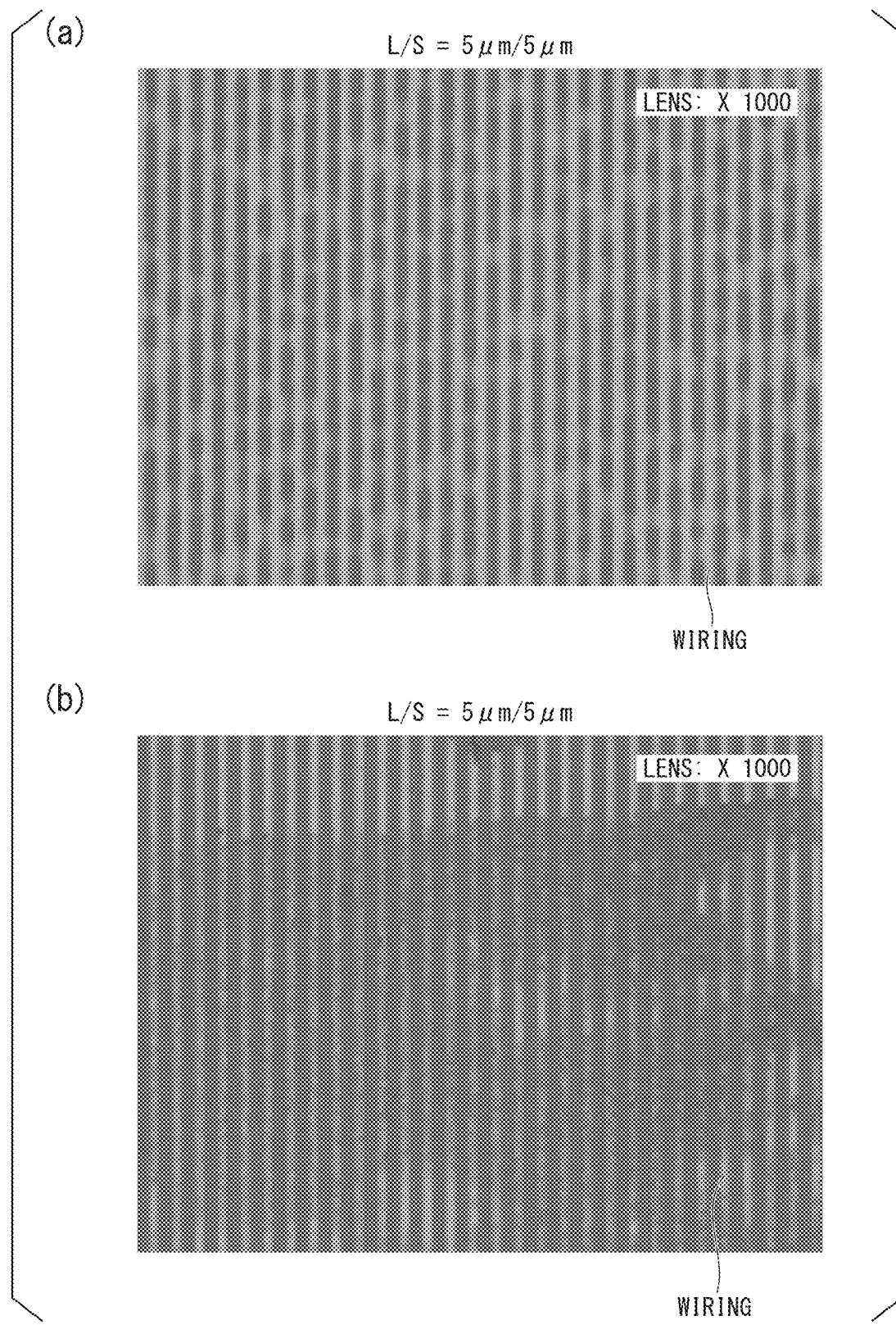
FIG. 11 shows photographs showing results of Example.

FIG. 10 and FIG. 11 are optical microscope photographs of fabricated wiring patterns. In the photograph, a whitely seen part corresponds to a wiring. FIG. 10 shows a wiring pattern formed as Example 1, and FIG. 11 shows a wiring pattern formed as Comparative Example 1.

As shown in FIG. 10, the wiring pattern of Example 1 was formed to have a uniform width. On the other hand, as shown in FIG. 11, in the wiring pattern of Comparative Example 1, the width of the wiring pattern was non-uniform (part (a) of FIG. 11) or the surface of the wiring pattern was roughened (part (b) of FIG. 11), and the size accuracy of the wiring was low.

Note that, in Example 2, it was also confirmed that a wiring pattern having a uniform width was formed.

Wiring Pattern Formation 2

Example 2

A gate electrode was formed on a PET substrate by using the same method as Example 1. An ultraviolet curable resin formed mainly by an epoxy resin (SU-8, manufactured by Nippon Kayaku Co., Ltd.) was applied by dip coating on the PET substrate in which the gate electrode was formed, and heating (prebaking) was performed at 105° C. for 5 minutes. Thereby, a coating film of an ultraviolet curable resin was formed.

Next, the coating film was exposed for 5 seconds with ultraviolet light having an intensity of 29 mW/cm$^2$ through a photomask and was heated (post-baked) at 105° C. for 60 minutes.

Next, the coating film was immersed in a developer (propyleneglycol-1-methylether-2-acetate, PEGMEA) to remove a part that was not irradiated with ultraviolet light, and the coating film was patterned. Then, a heat treatment was performed at 105° C. for 30 minutes, and a gate insulation film was formed.

Next, a first electrode that is a nickel-phosphorus electrode corresponding to the source electrode and the drain electrode was fabricated on the surface of the gate insulation film by using the same method as Example 1.

Next, the surface was water-washed, then was immersed into a gold plating bath for substitution for 1 minute, and further was immersed into a plating bath for reduction for 3 minutes to thereby perform electroless gold plating to coat the surface of the nickel-phosphorus electrode with gold, and a source electrode and a drain electrode were fabricated.

The formed wiring pattern functions as a transistor by forming a semiconductor layer so as to connect the source electrode and the drain electrode.

Comparative Example 2

A wiring pattern was fabricated similarly to Example 2 other than forming no protection layer after forming a base film when a nickel-phosphorus electrode corresponding to a source electrode and a drain electrode were fabricated on the surface of a gate insulation film.

Figure 12:
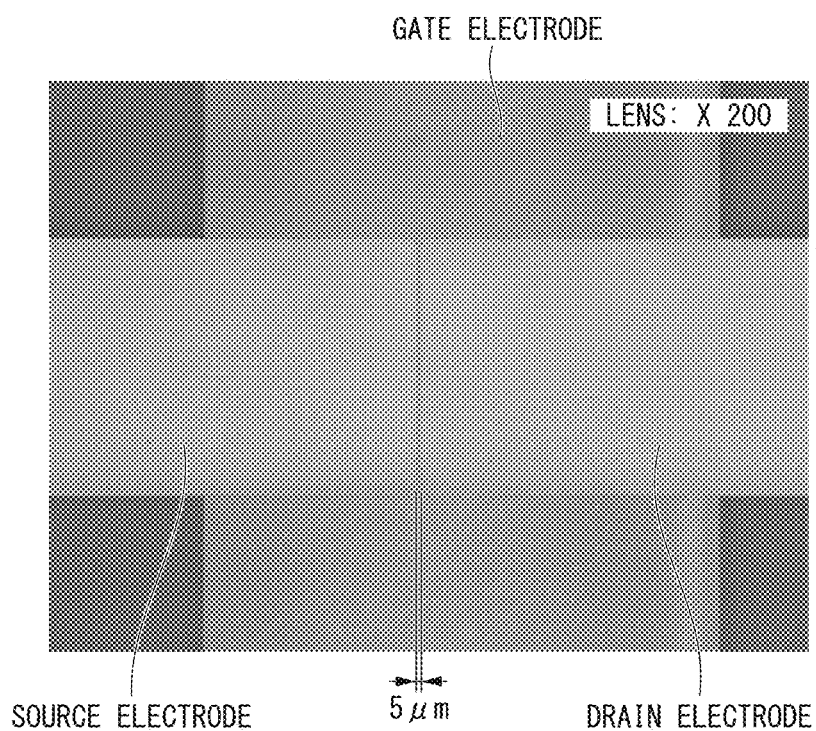
FIG. 12 shows a photograph showing a result of Example.
Figure 13:
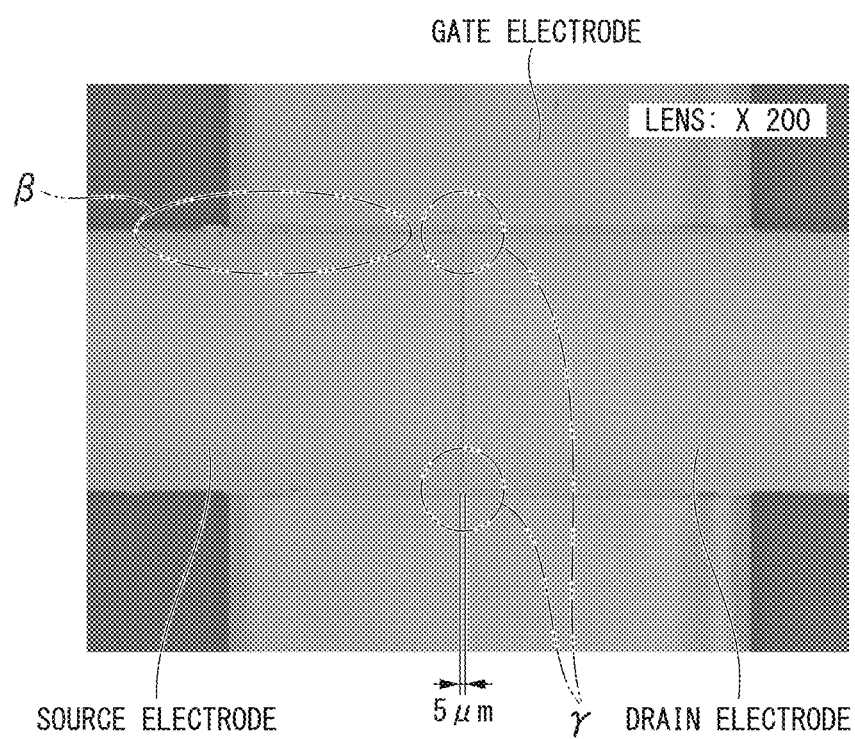
FIG. 13 shows a photograph showing a result of Example.

FIG. 12 and FIG. 13 are optical microscope photographs of fabricated wiring patterns. FIG. 12 shows a wiring pattern formed as Example 2, and FIG. 13 shows a wiring pattern formed as Comparative Example 2.

As shown in FIG. 12, the source electrode and the drain electrode of the wiring pattern of Example 2 were formed to have a uniform width, and the interval between the source electrode and the drain electrode was 5 μm.

On the other hand, as shown in FIG. 13, the size accuracy of the wiring with respect to the wiring pattern of Comparative Example 2 was low.

In the drawing, a region having an uneven width was confirmed in a section enclosed by a dashed line β.

Further, in the drawing, a region in which the gate electrode and the drain electrode were short-circuited was confirmed in a section enclosed by a dashed line γ. In FIG. 13, in a section where the gate electrode and the drain electrode were separated from each other, a shadow corresponding to end parts of the gate electrode and the drain electrode was able to be confirmed as a black line; however, in a section represented by the reference numeral γ, the line was interrupted. Since a shadow corresponding to an end part of an electrode is not formed at a short-circuit part, it is possible to determine that the section γ is a region where the gate electrode and the drain electrode are short-circuited.

From the above results, the usefulness of the present invention has been confirmed.

What is claimed is:

1. A transistor manufacturing method comprising:
    forming a source electrode and a drain electrode on a substrate;
    forming a layer including an insulator layer to cover the source electrode and the drain electrode; and
    forming a gate electrode,
    wherein the forming the gate electrode comprises
        applying a liquid body including a first formation material on at least part of the layer including the insulator layer to form a plating base film;
        applying a liquid body including a second formation material on at least part of a surface of the plating base film to form a protection layer of the plating base film;

forming a photoresist layer that includes a photoresist material on a surface of the protection layer to expose the photoresist layer with desired patterning light;

causing the exposed photoresist layer to come into contact with a developer to remove the photoresist layer and the protection layer until the plating base film is uncovered corresponding to the patterning light; and after depositing a metal as a catalyst for electroless plating on a surface of the uncovered plating base film, causing an electroless plating solution to come into contact with the catalyst on the surface of the plating base film to perform electroless plating, and wherein the transistor manufacturing method comprises exfoliating the protection layer and the photoresist layer after performing the electroless plating.

2. The transistor manufacturing method according to claim 1, wherein the second formation material is an organic silicon compound having a hydrolysis group that is bonded to a silicon atom.

3. The transistor manufacturing method according to claim 2, wherein the second formation material is an organic silicon compound having one hydrolysis group that is bonded to the silicon atom.

4. The transistor manufacturing method according to claim 2, wherein the second formation material is an organic silicon compound having two or three hydrolysis groups that are bonded to the silicon atom.

5. The transistor manufacturing method according to claim 1, wherein the first formation material is a silane coupling agent that includes a group having at least one of a nitrogen atom and a sulfur atom.

6. The transistor manufacturing method according to claim 5, wherein the silane coupling agent has an amino group.

7. The transistor manufacturing method according to claim 6, wherein the silane coupling agent is a primary amine or a secondary amine.

8. The transistor manufacturing method according to claim 1, wherein the substrate is made of a non-metallic material.

9. The transistor manufacturing method according to claim 8, wherein the substrate is made of a resin material.

10. The transistor manufacturing method according to claim 9, wherein the substrate has flexibility.

11. The transistor manufacturing method according to claim 9, wherein the plating base film is formed by a heat treatment at a heating temperature that is lower than a deformation temperature of the substrate.

12. A transistor manufacturing method comprising:
forming a source electrode and a drain electrode on a substrate;
forming a layer including an insulator layer to cover the source electrode and the drain electrode; and
forming a gate electrode,
wherein the forming the source electrode and the drain electrode on the substrate includes forming at least one of the source electrode and the drain electrode by:
applying a liquid body including a first formation material on at least part of the substrate to form a plating base film;
applying a liquid body including a second formation material on at least part of a surface of the plating base film to form a protection layer of the plating base film;
forming a photoresist layer that includes a photoresist material on an upper surface of the protection layer to expose the photoresist layer with desired patterning light;
causing the exposed photoresist layer to come into contact with a developer to remove the photoresist layer and the protection layer until the plating base film is uncovered corresponding to the patterning light; and
after depositing a metal as a catalyst for electroless plating on a surface of the uncovered plating base film, causing an electroless plating solution to come into contact with the catalyst on the surface of the plating base film to perform electroless plating, and
wherein the transistor manufacturing method comprises exfoliating the protection layer and the photoresist layer after performing the electroless plating.

* * * * *